United States Patent [19]

Litman et al.

[11] Patent Number: 5,644,132

[45] Date of Patent: Jul. 1, 1997

[54] SYSTEM FOR HIGH RESOLUTION IMAGING AND MEASUREMENT OF TOPOGRAPHIC AND MATERIAL FEATURES ON A SPECIMEN

[75] Inventors: Alon Litman, Nes Ziona; Alexander Goldenstein, Holon; Steven R. Rogers, Moshav Beit, all of Israel

[73] Assignee: Opan Technologies Ltd., Nes Ziona, Israel

[21] Appl. No.: 579,125

[22] Filed: Dec. 27, 1995

Related U.S. Application Data

[63] Continuation of Ser. No. 359,297, Dec. 19, 1994, abandoned, which is a continuation-in-part of Ser. No. 262,285, Jun. 20, 1994, Pat. No. 5,466,940.

[51] Int. Cl.$^6$ ............................ H01J 37/248; H01J 37/26
[52] U.S. Cl. ................................ 250/310; 250/397
[58] Field of Search .......................... 250/306, 309, 250/310, 397

[56] References Cited

U.S. PATENT DOCUMENTS

| | | | |
|---|---|---|---|
| 3,896,308 | 7/1975 | Venables et al. | 250/310 |
| 4,560,872 | 12/1985 | Antonovsky | 250/310 |
| 4,675,524 | 6/1987 | Frosien et al. | 250/310 |
| 4,785,176 | 11/1988 | Frosien et al. | 250/396 ML |
| 4,794,259 | 12/1988 | Sanderson et al. | 250/397 |
| 4,896,045 | 1/1990 | Okunuki et al. | 250/310 |
| 4,897,545 | 1/1990 | Danilatos | 250/310 |
| 4,926,054 | 5/1990 | Frosien | 250/310 |
| 4,933,552 | 6/1990 | Lee | 250/310 |
| 4,941,980 | 7/1990 | Halavee et al. | 250/310 |
| 5,412,211 | 5/1995 | Knowles | 250/310 |
| 5,466,940 | 11/1995 | Litman et al. | 250/397 |
| 5,502,306 | 3/1996 | Meisburger et al. | 250/310 |

FOREIGN PATENT DOCUMENTS

| | | |
|---|---|---|
| 0464917A1 | 6/1991 | European Pat. Off. . |
| 0661727A2 | 12/1994 | European Pat. Off. . |
| 58-142285 | 8/1993 | Japan . |
| WOA9004261 | 4/1990 | WIPO . |

OTHER PUBLICATIONS

Lee, K.M. et al, "Low Voltage Backscattered Electron Collection for Package Substrates and Integrated Circuit Inspection", J. of Vacuum Science & Tech., No. 6, pp. 3590–3595, Nov./Dec. 191.

Brugel, M., "E–Beam–Prober: Elektronenstrahl Als Tastspitze", Electronix, 40(1991) 23 Jul., 1991, pp. 63–66.

*Primary Examiner*—Bruce C. Anderson
*Attorney, Agent, or Firm*—Mark M. Friedman

[57] ABSTRACT

A particle beam column for high-resolution imaging and measurement of topographic and material features on a specimen. The particle beam column includes a particle source for providing a primary beam along a primary beam axis for impinging on the specimen so as to release secondary electrons and backscattered electrons therefrom. The particle beam column also includes an objective lens for focussing the electrons so as to provide a radial dispersion of electrons relative to the primary beam axis, the radial dispersion of electrons including an inner annulus of backscattered electrons and an outer annulus of secondary electrons. The particle beam column still further includes a backscattered electron detector for detecting the inner annulus of backscattered electrons and a secondary electron detector for detecting the outer annulus of secondary electrons.

9 Claims, 5 Drawing Sheets

SYSTEM FOR HIGH RESOLUTION IMAGING AND MEASUREMENT OF TOPOGRAPHIC AND MATERIAL FEATURES ON A SPECIMEN

The present application is a Continuation of U.S. patent application Ser. No. 08/359,297, filed Dec. 19, 1994, abandoned which is a Continuation-in-Part of U.S. patent application Ser. No. 08/262,285, filed Jun. 20, 1994, now U.S. Pat. No. 5,466,940, issued Nov. 14, 1995.

FIELD AND BACKGROUND OF THE INVENTION

The present invention relates to particle beam imaging and measurement equipment in general and in particular to automated in-process scanning electron beam equipment for performing high resolution imaging and measurement of semiconductor wafers having topographic and/or material features.

As integrated circuits are fabricated with features smaller than the wavelength of visible light, electron beam imaging has been established as the technology of choice for process development and quality assurance, as described by M. H. Bennett and G. E. Fuller in an article entitled "In-Process Inspection and Metrology of Semiconductor Wafers with the Use of an Automated Low-Voltage SEM," Microbeam Analysis 1986, pp. 649–652.

When a particle beam impinges on a specimen, there is a release of electrons from the specimen. The electrons are broadly divided into two categories: electrons with energies below 50 electron volts which are referred to as secondary electrons and electrons with energies equal to or greater than 50 electron volts which are referred to as backscattered electrons.

As described by L. Reimer in a book entitled "Image Formation in Low-Voltage Scanning Electron Microscopy", SPIE Optical Engineering Press, 1993, secondary electrons reveal topographic details of the specimen surface whereas, backscattered electrons discriminate between different materials included in the specimen.

U.S. Pat. No. 4,941,980 to Halavee et al discloses an apparatus and method for measuring a topographic feature employing four electron detectors, spaced evenly in a circle around an electron column, which directs a primary electron beam at normal incidence to a specimen. To attract the secondary electrons emitted by the specimen, a positive charge is applied simultaneously to two oppositely disposed electron detectors. As the primary beam is scanned over the surface of the specimen, the signals from the two charged detectors are combined so as to make a cross-sectional profile of topographic features on the specimen. By alternating between the two pairs of oppositely placed detectors, profiles can be obtained along two orthogonal directions. In this prior art, a relatively long working distance of at least several millimeters must be maintained between the specimen and the electron column in order to facilitate collection of secondary electrons by the surrounding electron detectors.

In addition to the measurement methods presented in the aforementioned patent, the signals from the four spatial detectors can be combined using stereoscopic methods described by P. Atkin and K. C. A. Smith in an article entitled "Automatic Stereometry and Special Problems of the SEM", Electron Microscopy and Analysis, Institute of Physics Conference Series Number 68, 1983, pp. 219–222 to provide indirect three dimensional imaging and measurement of the specimen surface.

U.S. Pat. Nos. 4,728,790 and 4,785,176 disclose an electrostatic-magnetic objective lens which provides both high resolution focussing of the primary beam on the specimen and efficient collection of electrons emitted therefrom. A scintillator detector, placed above the objective lens, generates a signal which is proportional to the total electron emission from the specimen. In this prior art, there is no provision for spatial discrimination using multiple detectors, nor is there a provision for separate detection of secondary and backscattered electrons.

U.S. Pat. No. 4,896,036 discloses a detector objective for scanning microscopes consisting of a purely electrostatic objective lens and an annular detector placed above the objective lens. This arrangement has the advantage of preserving the spatial orientation of the detected electrons, by eliminating the Larmor rotation that generally occurs in magnetic objectives. However, electrostatic objectives are known to have large chromatic aberrations, which limit their resolution at low primary beam energies. This is a disadvantage in semiconductor applications, for which low beam energies are needed to avoid specimen charging and damage.

There is therefore a need for particle beam column which provides very high resolution topographic and/or material feature discrimination of a specimen.

SUMMARY OF THE PRESENT INVENTION

The present invention is for a particle beam column which provides very high resolution topographic and/or material feature discrimination of a specimen.

Hence, according to the teachings of the present invention, there is provided, a particle beam column for high-resolution imaging and measurement of topographic and material features on a specimen, the particle beam column comprising: (a) a particle source for providing a primary beam along a primary beam axis, the primary beam impinging on the specimen so as to release electrons therefrom, the electrons including secondary electrons and backscattered electrons; (b) an objective lens for focussing the electrons so as to provide a radial dispersion of the electrons relative to the primary beam axis, the radial dispersion of electrons including an inner annulus of backscattered electrons and an outer annulus of secondary electrons; (c) a backscattered electron detector for detecting the inner annulus of backscattered electrons, the backscattered electron detector being located between the particle source and the objective lens; and (d) a secondary electron detector for detecting the outer annulus of secondary electrons, the secondary electron detector being located between the particle source and the objective lens.

According to a further feature of the present invention, the objective lens includes an electrostatic objective lens.

According to a still further feature of the present invention, the objective lens includes a magnetic objective lens.

According to a yet still further feature of the present invention, the objective lens includes an electrostatic objective lens and a magnetic objective lens, the electrostatic objective lens deployed between the specimen and the magnetic objective lens so as to preserve the angular orientation of the secondary electrons.

According to a yet still further feature of the present invention, the secondary electron detector and the backscattered electron detector are realized as a single electron detector.

According to a yet still further feature of the present invention, the backscattered electron detector is deployed above the secondary electron detector relative to the specimen.

According to a yet still further feature of the present invention, the backscattered electron detector is annular.

According to a yet still further feature of the present invention, the secondary electron detector is split into angular sectors so as to provide pairs of signals for linewidth measurements of topographic features.

According to a yet still further feature of the present invention, the secondary electron detector can distinguish topographic features which protrude from the specimen from those which are recessed into the specimen.

According to a yet still further feature of the present invention, electric potentials are applied to the surface of the backscattered electron detector so as to increase the acceptance of backscattered electrons close to the primary beam axis.

According to a yet still further feature of the present invention, further comprising a beam shield tube having a flange constructed in a geometrical shape and of a material so as to increase the acceptance of backscattered electrons close to the primary beam axis.

BRIEF DESCRIPTION OF THE DRAWINGS

These and further constructional features of the invention will be appreciated in the light of the ensuing description of a preferred embodiment thereof, given by way of example only with reference to the accompanying drawings, wherein.

DESCRIPTION OF THE PREFERRED EMBODIMENT

The present invention is of a particle beam column which enables both high resolution imaging and measurement of topographic features and material features on a specimen.

The principles and operation of the particle beam column according to the present invention may be better understood with reference to the drawings and the accompanying description.

Figure 1:
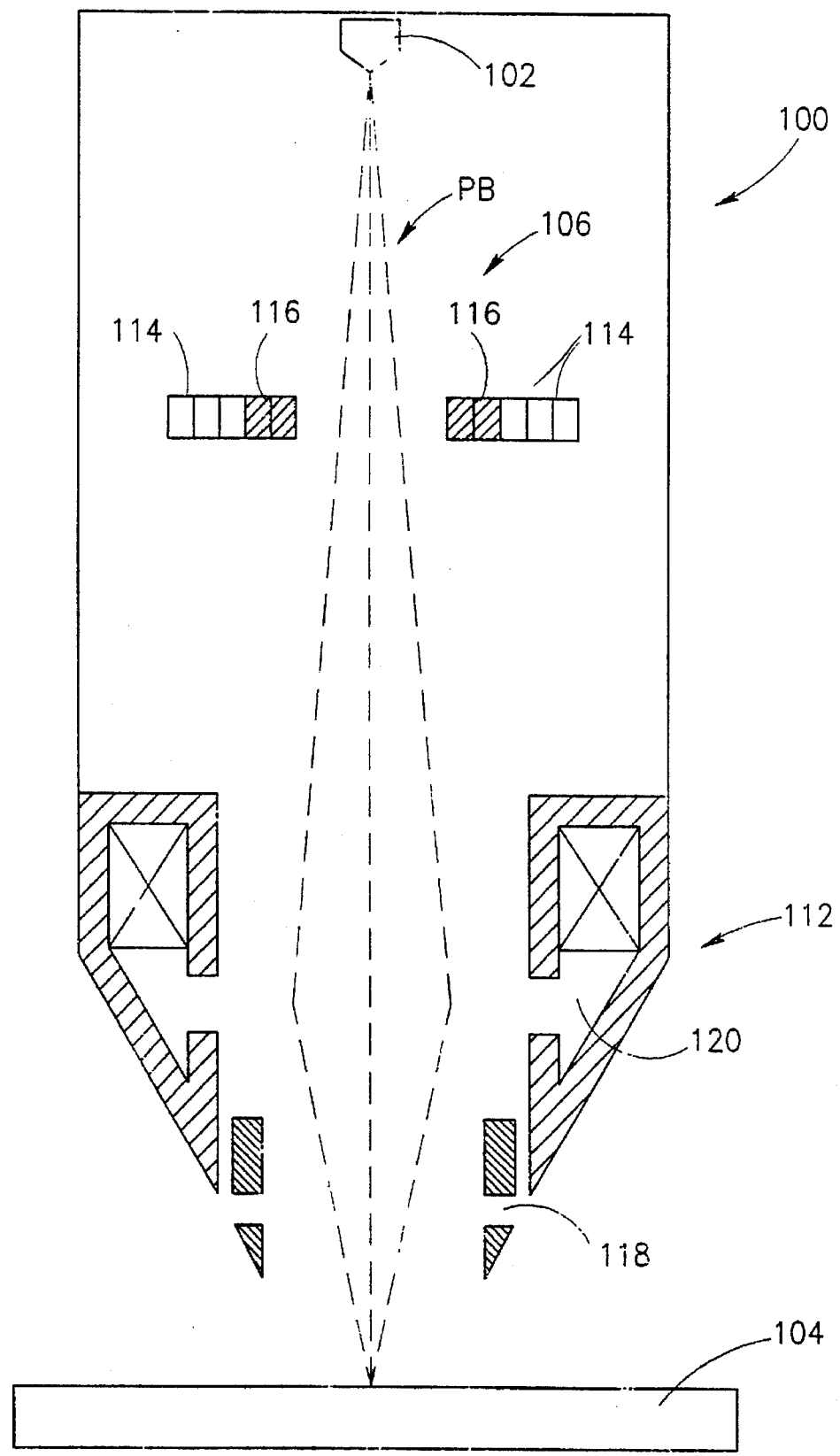
FIG. 1 is a schematic view of a preferred embodiment of a particle beam column, constructed and operative according to the teachings of the present invention, for enabling both high resolution imaging and measurement of topographic features and material features on a specimen.
Figure 2:
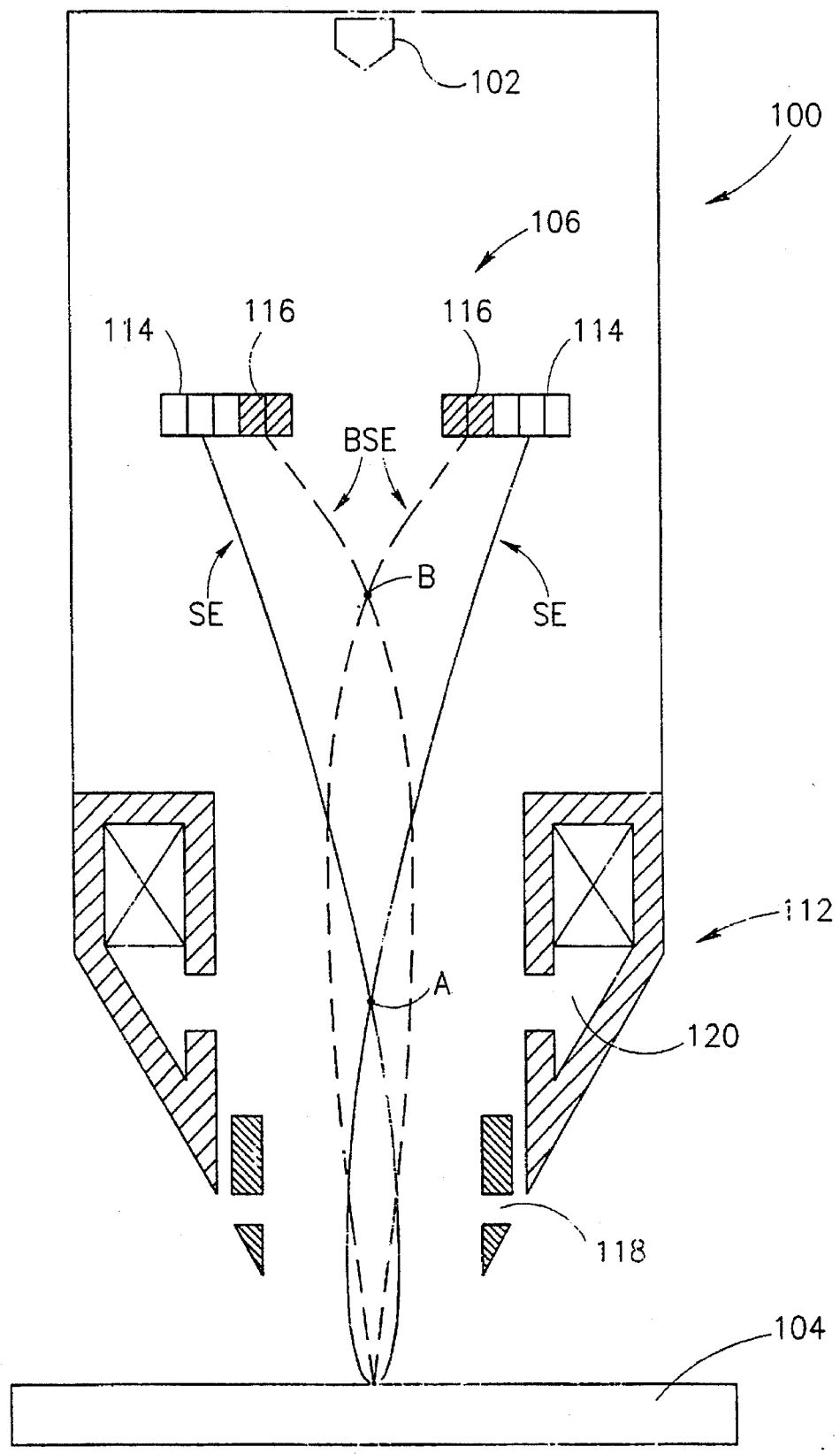
FIG. 2 is a schematic view illustrating the trajectories of secondary electrons (SEs) and backscattered electrons (BSEs) as they travel from the specimen to their respective electron detectors deployed within the particle beam column.
Figure 3:
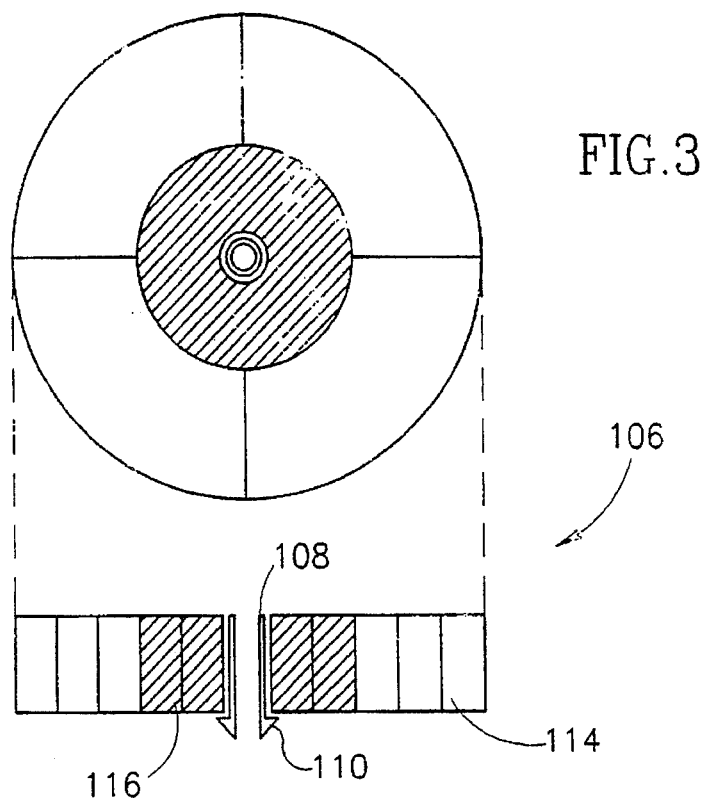
FIG. 3 is a schematic view of a preferred embodiment of the electron detector included in the particle beam column of FIG. 1.

Referring now to the drawings, FIGS. 1–3 show a preferred embodiment of a particle beam column, generally designated 100, constructed and operative according to the teachings of the present invention, for enabling high resolution imaging and measurement of both topographic features and material features on a specimen. Generally speaking, this capability is achieved by distinguishing between the secondary electrons (SEs) and the backscattered electrons (BSEs) emitted from a specimen bombarded with a primary beam. This enables the SEs to be employed for high resolution imaging and measurement of topographic features on a specimen and the BSEs to be employed for high resolution imaging and measurement of material features on a specimen. The SEs and the BSEs can be distinguished by their disparate radial dispersion relative to the primary beam axis of the primary beam. The disparate radial dispersal of the SEs and the BSEs is due to the BSEs being more energetic than the SEs.

Particle beam column 100 includes a particle source 102 for scanning the surface of a specimen 104 with a freely focussed primary beam denoted PB. Particle source 102 is preferably a field-emission electron source characterized by a virtual source size of several nanometers and an energy spread of several tenths of an electron volt. Primary beam electrons typically have kinetic energies greater than 200 eVs and travel along a primary beam axis.

Particle beam PB passes through the center of an electron detector 106 including a beam shielding tube 108 with a flange termination 110 formed of conducting and preferably non-magnetic materials and maintained at nearly the same potential as the surrounding column so as to prevent shifting or aberration of primary beam PB as it passes through electron detector 106. As known in the art, deployment of electron detector 106 inside particle beam column 100 enables the use of a very short working distance between specimen 104 and column 100. Insofar as aberrations of primary beam PB generally increase with working distance, high resolution and measurement accuracy can be achieved with this configuration.

Primary beam electrons cause a release of electrons from the surface of specimen 104 having kinetic energies ranging from zero to the kinetic energy of primary beam PB. The electrons emitted from specimen 104 therefore include both BSEs and SEs. On leaving the specimen, the SEs become spatially separated according to their angles of emission from the different surfaces as described in greater detail with respect to FIG. 4.

Figure 4:
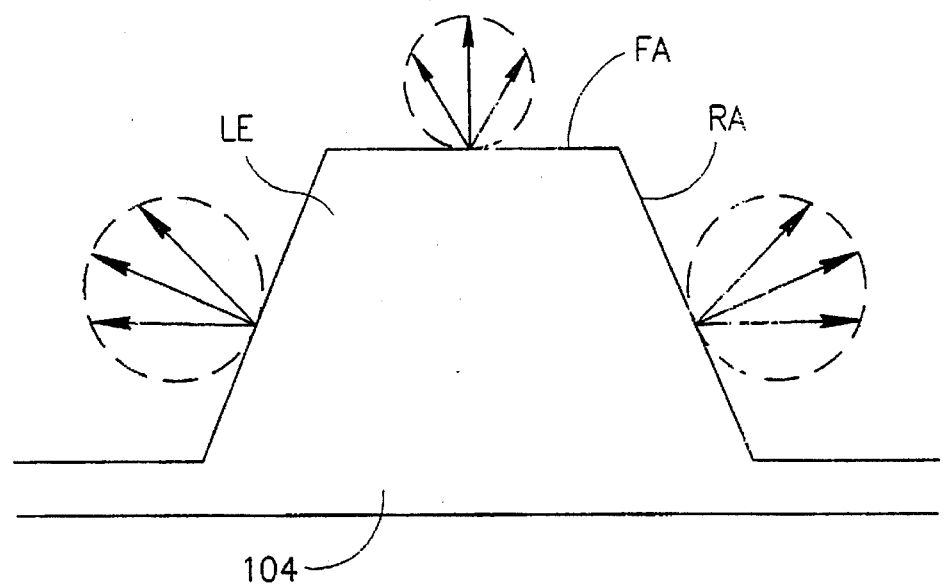
FIG. 4 is a graph illustrating the angular distribution of secondary electrons emitted from a topographic feature on the specimen.

Turning briefly to FIG. 4, in the case that specimen 104 includes a topographic feature having a left edge LE, a flat area FA and a fight edge RE, SEs emitted from edges LE and RE are concentrated on the left side and right side, respectively, of the feature whereas SEs emitted from the flat area FA are split more or less equally between the two sides. It should be noted that the circles, which are polar representations of the well-known Lambertian or cosine-law angular distribution for secondary emission, indicate that secondary emission is strongest in the direction perpendicular to the surface. Furthermore, the total emission intensity is greater at edges LE and RE, where primary beam PB enters specimen 104 at grazing incidence, than at flat area FA, thereby explaining the strong correlation between surface topography and secondary electron emission.

The electrons emitted from specimen 104 are focussed by an objective lens, generally designated 112, causing the SEs to cross over at a SE crossover point A and BSEs to cross over at a BSE crossover point B. As can be readily seen, BSE crossover point B is substantially higher than SE crossover point A relative to specimen 104 due to the BSEs being more energetic than the SEs. After passing through their respective crossover points, the SEs and the BSEs travel toward electron detector 106 along trajectories which are near straight lines in the meridional plane of objective lens 112.

Figure 5:
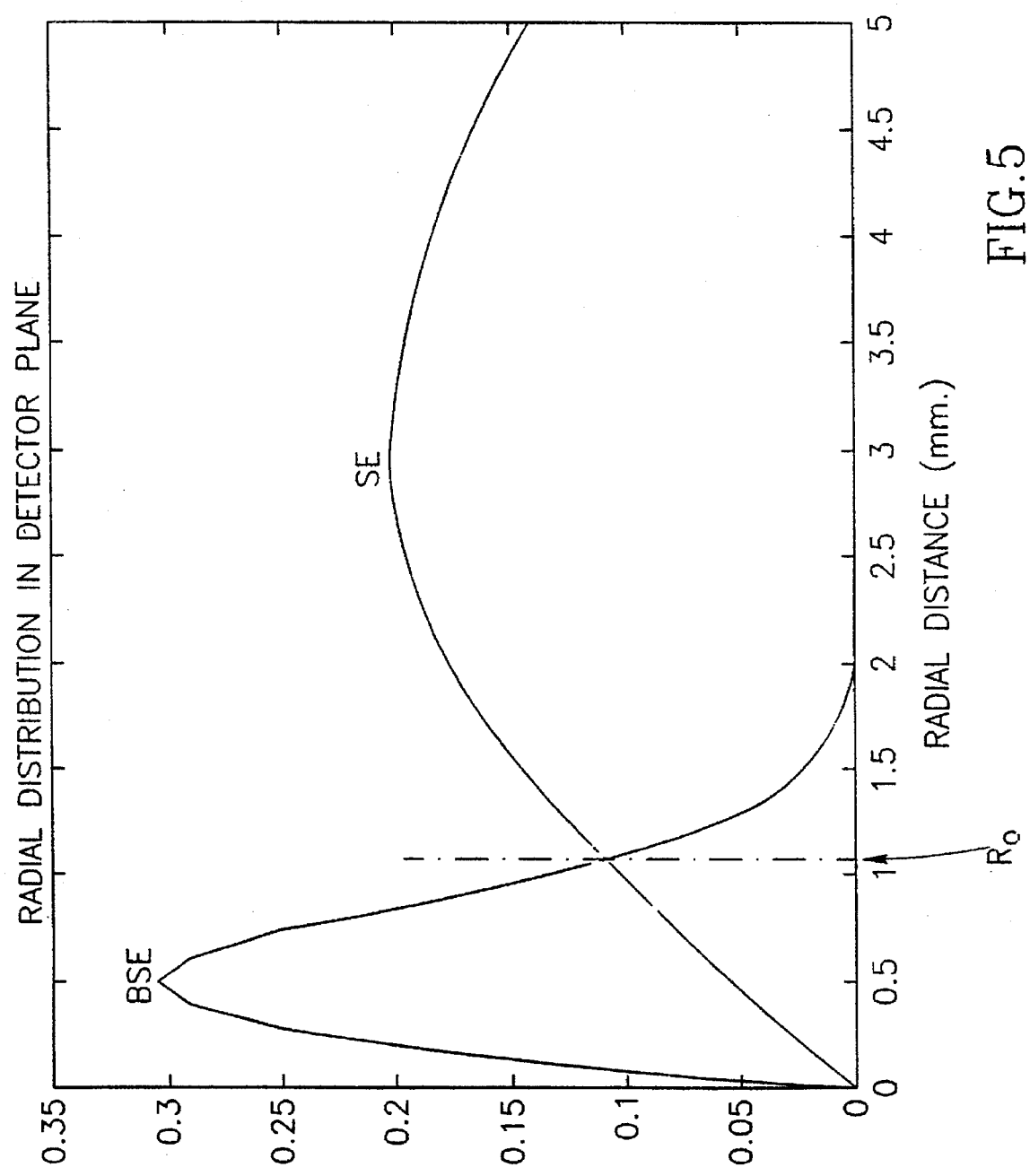
FIG. 5 is a graph illustrating the radial distribution of secondary and backscattered electrons at the detector plane of the particle beam column of FIG. 1.

Hence, the radial dispersion of SEs from the primary beam axis at electron detector 106 is greater than that of the BSEs because the distance from SE crossover point A to electron detector 106 is greater than the distance from BSE crossover point B to electron detector 106. In other words, the radial dispersion of electrons includes an outer annulus of SEs and an inner annulus of BSEs. Thus, in contrast to conventional electron detectors, electron detector 106 includes a secondary electron (SE) detector 114 for detecting the outer annulus of SEs and a backscattered electron (BSE) detector 116 for detecting the inner annulus of BSEs. Efficient separation of SEs and BSEs is achieved by selecting the outer radius of BSE detector 116 to be equal to a value $R_o$ as depicted in FIG. 5.

Objective lens 112 is preferably implemented as the combined electrostatic-magnetic objective lens described U.S. Pat. No. 4,785,176 including an electrostatic objective lens 118 and a magnetic objective lens 120 deployed above electrostatic objective lens 118 relative to specimen 104 for reasons described hereinbelow. As known in the art, such an objective lens enables, on the one hand, the use of a high energy primary beam PB, for example, in the order of about 9000 eVs, thereby minimizing chromatic aberration effects, and on the other hand, the stripping away of most of the energy of the electrons just before their impingement on specimen 104 such that impinging electrons have a relatively low landing energy in the order of about 1000 eVs. However, it should be noted that objective lens 112 can be implemented as an electrostatic objective lens or a magnetic objective lens, although at a lower resolution than the combined electrostatic-magnetic objective lens.

First, electrostatic objective lens 118 of objective lens 112 accelerates the electrons emitted from specimen 104 to kinetic energies of several kiloelectron volts toward electron detector 106. Then, magnetic objective lens 120 of objective lens 112 rotates the electrons through an angle θ about the primary beam axis as they pass therethrough, the angle θ given by: $\theta = kB/\sqrt{U}$ where k is a constant, B is the magnetic field strength, and U is the electron kinetic energy in an action known as a "Larmor rotation".

Because the energy spread of the SEs is only 50 electron volts, which is a small fraction of their total kinetic energies after acceleration by electrostatic objective lens 118, the SEs rotate through very nearly the same angle. In other words, the SEs rotate as a rigid body about the PB axis, thereby maintaining their topographic ordering which existed in the plane of electrostatic objective lens 118. In contrast, the BSEs have widely differing kinetic energies and therefore do not rotate as a rigid body. However, this is of no consequence because it is the intensity of the BSEs which conveys material information rather than their angular distribution.

It should be emphasized that interchanging the positions of electrostatic objective lens 118 and magnetic objective lens 120 would lead to destruction of the topographic information carried by the SEs. In this case, the Larmor rotations of SEs differing in energy by a few electron volts would be vastly different, and the angular information would be totally scrambled by propagation through magnetic objective lens 118.

SE detector 114 and BSE detector 116 are preferably implemented as a single device in which SE detector 114 is preferably split into four sectors as shown in FIG. 3 in order to perform linewidth measurements in the manner described in U.S. Pat. No. 4,941,980 which is incorporated herein by reference and BSE detector 116 is implemented as an annular ring. Therefore, electron detector 106 provides five output signals simultaneously, in series or parallel, corresponding to four spatial SE signals and one BSE signal. All in all, these signals can provide a material image and one or more topographic images. Alternatively, the images can be overlayed by known stereoscopic methods to provide a three-dimensional topographic image with color shading to indicate material composition.

Figure 6:
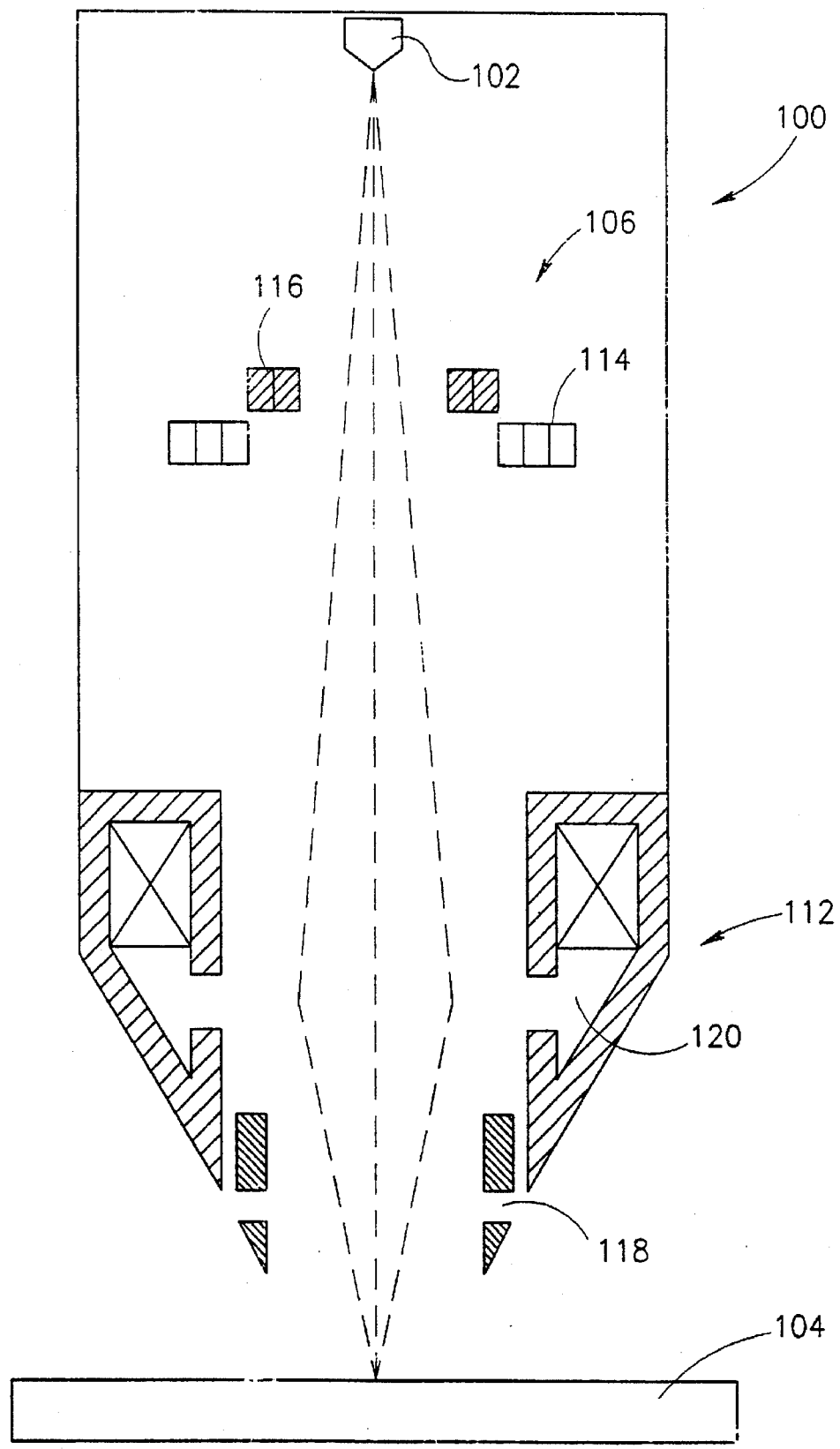
FIG. 6 is a schematic view of a second embodiment of a particle beam column for enabling both high resolution imaging and measurement of topographic features and material features on a specimen.

It should be noted that the number of sectors of SE detector 114 can be less than, equal to, or greater than four, depending upon the orientations of features in the plane of specimen 104 and the required degree of spatial discrimination. Furthermore, SE detector 114 and BSE detector 116 can be implemented as discrete devices as shown in FIG. 6. This design has the advantage of enabling independent gain adjustment of SE detector 114 and BSE detector 116 and of permitting separate replacement of the detectors for maintenance.

Both SE and BSE detectors 114 and 116 can be readily fabricated using existing technology for scintillator, solid-state or microchannel plate electron detectors. It should be noted that the sectors of SE detector 114 and the annular ring of BSE detector 116 can be formed in either a physical or an electronic manner. For example, a microchannel plate electron detector can be fabricated with physical regions on its collecting anode which correspond to those shown in FIG. 3. Alternatively, a position-sensitive microchannel plate electron detector can be used, in which the position of each electron hitting the surface of the detector is measured electronically. In this case, impacts would be counted in each sector of SE detector 114 and in the annular ring of BSE detector 116 using analog or digital accumulators. Alternatively, the sectors of SE detector 114 and the annular ring of BSE detector 116 could be fabricated from discrete devices, such as Everhart-Thornley scintillator electron detectors. In either physical or electronic implementations, the principle of angular discrimination of the SEs and the principle of radial separation of SEs and BSEs remain the same.

When imaging and measuring deep surface structures, such as trenches and contact holes, in semiconductor wafers, the detection of near-axial BSEs is preferably enhanced by applying the teachings of pending U.S. patent application Ser. No. 08/262,285. This is achieved forming flange termination 110 from material which facilitates the generation of secondary electrons by impacting BSEs and applying potentials to the active surfaces of BSE detector 116 and flange termination 110 so as to efficiently collect these SEs, as fully set forth in US Pat. No. 5,466,940.

While the invention has been described with respect to a limited number of embodiments, it will be appreciated that many variations, modifications and other applications of the invention can be made.

What is claimed is:

1. A particle beam apparatus for charge-free high-resolution imaging and measurement of topographic and material features on a specimen, the particle beam apparatus comprising:

(a) a particle source for providing a primary beam along a primary beam axis, said primary beam impinging on the specimen so as to release electrons therefrom, said electrons including secondary electrons and backscattered electrons;

(b) an objective lens for focussing said electrons so as to provide a radial dispersion of said electrons relative to said primary beam axis, said radial dispersion of electrons including an inner annulus of backscattered electrons and an outer annulus of secondary electrons;

(c) a backscattered electron detector for detecting said inner annulus of backscattered electrons, said backscattered electron detector being located between said particle source and said objective lens;

(d) a secondary electron detector for detecting said outer annulus of secondary electrons, said secondary electron detector being located between said particle source and said objective lens; and (e) an evacuated chamber for housing the specimen.

2. The particle beam column as in claim 1 wherein said objective lens includes an electrostatic objective lens.

3. The particle beam column as in claim 1 wherein said objective lens includes a magnetic objective lens.

4. The particle beam column as in claim 1 wherein said objective lens includes an electrostatic objective lens and a magnetic objective lens, said electrostatic objective lens deployed between the specimen and said magnetic objective lens so as to preserve the angular orientation of the secondary electrons.

5. The particle beam column as in claim 1 wherein said secondary electron detector and said backscattered electron detector are realized as a single electron detector.

6. The particle beam column as in claim 1 wherein said backscattered electron detector is deployed above said secondary electron detector relative to the specimen.

7. The particle beam column as in claim 1 wherein said backscattered electron detector is annular.

8. The particle beam column as in claim 1 wherein said secondary electron detector is split into angular sectors so as to provide pairs of signals for linewidth measurements of topographic features.

9. The particle beam column as in claim 8 wherein said secondary electron detector is split into angular sectors so as to distinguish topographic features which protrude from the specimen from those which are recessed into the specimen.

* * * * *

UNITED STATES PATENT AND TRADEMARK OFFICE
CERTIFICATE OF CORRECTION

PATENT NO. : 5,644,132
DATED : July 1, 1997
INVENTOR(S) : Litman, et al

It is certified that error appears in the above-identified patent and that said Letters Patent is hereby corrected as shown below:

On the title page, item [73] Assignee, "Opan Technologies Ltd." should read -- Opal Technologies Ltd. --

Signed and Sealed this

Third Day of February, 1998

Attest:

BRUCE LEHMAN

*Attesting Officer*           *Commissioner of Patents and Trademarks*